United States Patent
Park et al.

(10) Patent No.: US 9,893,092 B2
(45) Date of Patent: Feb. 13, 2018

(54) THIN-FILM TRANSISTOR ARRAY SUBSTRATE HAVING OXIDE SEMICONDUCTOR WITH CHANNEL REGION BETWEEN CONDUCTIVE REGIONS

(71) Applicant: Samsung Display Co., Ltd., Yongin, Gyeonggi-Do (KR)

(72) Inventors: Junhyun Park, Yongin (KR); Sunghwan Kim, Yongin (KR); Kyoungju Shin, Yongin (KR); Chongchul Chai, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/927,269

(22) Filed: Oct. 29, 2015

(65) Prior Publication Data
US 2016/0300852 A1    Oct. 13, 2016

(30) Foreign Application Priority Data

Apr. 7, 2015  (KR) .......................... 10-2015-0049079

(51) Int. Cl.
*H01L 27/12* (2006.01)
*H01L 29/786* (2006.01)
*H01L 29/66* (2006.01)

(52) U.S. Cl.
CPC .......... *H01L 27/124* (2013.01); *H01L 27/127* (2013.01); *H01L 27/1214* (2013.01);
(Continued)

(58) Field of Classification Search
None
See application file for complete search history.

(56) References Cited

U.S. PATENT DOCUMENTS 7,061,461 B2    6/2006  Hong
7,075,161 B2 *  7/2006  Barth ............... G01N 33/48721
                                                      257/414
(Continued)

FOREIGN PATENT DOCUMENTS

KR   10-2013-0035744    4/2013
KR   10-2013-0055329    5/2013

OTHER PUBLICATIONS

Definition of aligned, (n.d.) American Heritage® Dictionary of the English Language, Fifth Edition. (2011). Retrieved Feb. 6, 2017 from http://www.thefreedictionary.com/aligned.*

*Primary Examiner* — Michael Jung
(74) *Attorney, Agent, or Firm* — Innovation Counsel LLP

(57) ABSTRACT

Provided is a method of manufacturing TFT substrate, the method including: forming a first conductive layer and a gate electrode; forming a gate insulating layer covering the first conductive layer and the gate electrode; forming a first contact hole exposing the first conductive layer through the gate insulating layer; forming, on the gate insulating layer of a pixel area, an oxide semiconductor pattern comprising a first region which is conductive, a second region which is conductive, and a third region between the first region and the second region; forming a source electrode contacting the first region of the oxide semiconductor pattern, a drain electrode contacting the second region of the oxide semiconductor pattern and a second conductive layer contacting the first conductive layer on a non-pixel area. Each of the first region and the second region overlaps the gate electrode.

8 Claims, 17 Drawing Sheets

(52) U.S. Cl.
CPC ...... *H01L 27/1225* (2013.01); *H01L 27/1288* (2013.01); *H01L 29/66969* (2013.01); *H01L 29/7869* (2013.01); *H01L 29/78693* (2013.01)

(56) References Cited

U.S. PATENT DOCUMENTS

| | | | | |
|---|---|---|---|---|
| 8,324,699 | B2* | 12/2012 | Ichijo | C23C 16/02 257/228 |
| 2003/0127649 | A1* | 7/2003 | Chae | G02F 1/13458 257/72 |
| 2004/0160400 | A1 | 8/2004 | Hong | |
| 2006/0243979 | A1* | 11/2006 | Park | G02F 1/136209 257/59 |
| 2009/0152554 | A1* | 6/2009 | Cho | H01L 27/1229 257/59 |
| 2010/0084654 | A1* | 4/2010 | Yamazaki | H01L 27/0248 257/43 |
| 2013/0063675 | A1* | 3/2013 | Misaki | H01L 29/7869 349/46 |
| 2013/0099240 | A1* | 4/2013 | Lee | H01L 29/7869 257/59 |
| 2013/0334530 | A1* | 12/2013 | Katoh | H01L 27/1222 257/43 |
| 2014/0117380 | A1* | 5/2014 | Loboda | H01L 21/02035 257/77 |
| 2014/0159033 | A1* | 6/2014 | Jeong | H01L 29/66969 257/43 |
| 2014/0306250 | A1* | 10/2014 | Gardner | H01L 25/0753 257/89 |
| 2015/0187817 | A1* | 7/2015 | Kim | G02F 1/136227 257/72 |
| 2015/0286082 | A1* | 10/2015 | Nishiki | G02F 1/1368 349/43 |

* cited by examiner

THIN-FILM TRANSISTOR ARRAY SUBSTRATE HAVING OXIDE SEMICONDUCTOR WITH CHANNEL REGION BETWEEN CONDUCTIVE REGIONS

CROSS-REFERENCE TO RELATED APPLICATION

This application claims the benefit of Korean Patent Application No. 10-2015-0049079, filed on Apr. 7, 2015, in the Korean Intellectual Property Office, the disclosure of which is incorporated herein in its entirety by reference.

BACKGROUND

1. Field

One or more exemplary embodiments relate to a method of manufacturing a thin film transistor (TFT) array substrate and a TFT array substrate manufactured by the method.

2. Description of the Related Art

A flat panel display apparatus such as an organic light-emitting display apparatus and a liquid crystal display (LCD) apparatus is formed on a substrate on which a pattern, which includes at least one thin film transistor (TFT), a capacitor, etc. and a wire that connect the TFT, the capacitor, etc. to one another, is formed for its operation. The TFT includes an active layer providing a channel area, a source area, and a drain area, and a gate electrode that is formed to overlap the channel area and is electrically insulated from the active layer by a gate insulating layer.

The active layer of the TFT is usually formed of a semiconductor material such as amorphous silicon or polysilicon. When the actively layer is formed of amorphous silicon, it is difficult to implement a driver circuit that is driven at a high speed, due to its low mobility. When the actively layer is formed of polysilicon, the active layer has high mobility, but there is a need to use a separate compensation circuit because a threshold voltage is non-uniform. Also, since a conventional method of manufacturing a TFT using low temperature polysilicon (LTPS) includes costly processes such as a laser heat treatment, large amount money is needed for investment in facilities and maintenance. Also it is difficult to use the LTPS process to large substrates. Recently, research into an oxide semiconductor as an active layer has been conducted to solve the above problem.

SUMMARY

One or more exemplary embodiments include a method of manufacturing a thin film transistor (TFT) array substrate and a TFT array substrate manufactured by the method.

Additional aspects will be set forth in part in the description which follows and, in part, will be apparent from the description, or may be learned by practice of the presented embodiments.

According to one or more exemplary embodiments, a method of manufacturing a thin film transistor (TFT) substrate, includes: forming a first conductive layer on a non-pixel area of a substrate and a gate electrode on a pixel area of the substrate; forming a gate insulating layer covering the first conductive layer and the gate electrode; a first contact hole exposing the first conductive layer through the gate insulating layer; forming, on the gate insulating layer of the pixel area, an oxide semiconductor pattern comprising a first region which is conductive, a second region which is conductive, and a third region between the first region and the second region; forming a source electrode contacting the first region of the oxide semiconductor pattern, a drain electrode contacting the second region of the oxide semiconductor pattern and a second conductive layer contacting the first conductive layer on a non-pixel area, wherein each of the first region and the second region overlaps the gate electrode.

The third region may overlap the gate electrode, each of an edge of the first region and an edge of the second region may overlap the gate electrode, and each of an edge of the source electrode adjacent to the gate electrode and an edge of the drain electrode adjacent to the gate electrode may not overlap the gate electrode.

The forming of the first contact hole may include forming the first contact hole exposing the first conductive layer using a first photoresist pattern having a first opening and removing the gate insulating layer exposed by the first opening. The forming of the oxide semiconductor pattern may include: forming an oxide semiconductor layer comprising a first region, a second region, and a third region disposed between the first region and the second region; making the first region and the second region be conductive by using a second photoresist pattern; removing the second photoresist pattern; and patterning the oxide semiconductor layer.

The first photoresist pattern and the second photoresist pattern may be formed through a same mask process.

The first photoresist pattern may be formed using a halftone mask or a diffraction mask.

The second photoresist pattern may be formed by ashing the first photoresist pattern.

Portions of the first photoresist pattern, which correspond to the first region and the second region, may have a smaller thickness than a portion of the first photoresist pattern, which corresponds to the third region, and the second photoresist pattern may include openings formed to correspond to the first region and the second region.

In the making of the first region and the second region be conductive, a plasma treatment may be performed for the first region and the second region such that the first region and the second region are deoxidized.

The making of the first region and the second region be conductive may include; forming a layer including hydrogen on the first region and the second region and deoxidizing the first region and the second region by a heat treatment; and removing the layer comprising hydrogen.

In the patterning of the oxide semiconductor layer, the oxide semiconductor layer may be patterned using a third photoresist pattern. The forming of the source electrode and the drain electrode may include: forming a metal layer; and forming the source electrode and the drain electrode by using a fourth photoresist pattern formed on the metal layer.

The third photoresist pattern and the fourth photoresist pattern may be formed through a same mask process.

The third photoresist pattern may be formed using a halftone mask or a diffraction mask.

The forming of the metal layer may be performed before the patterning of the oxide semiconductor layer, and the patterning of the oxide semiconductor layer may include: forming, on the metal layer, the third photoresist pattern corresponding to the first region, the second region, and the third region; and patterning the metal layer and an oxide semiconductor layer disposed under the metal layer by using the third photoresist pattern.

The forming of the source electrode and the drain electrode may include: forming the fourth photoresist pattern by ashing the third photoresist pattern disposed on the patterned metal layer; and forming a source electrode overlapping a portion of the first region and a drain electrode overlapping a portion of the second region by using the fourth photoresist pattern.

The fourth photoresist pattern may include an opening exposing the third region, an edge of the first region adjacent to the third region, and an edge of the second region adjacent to the third region. A size of the opening may be greater than a size of the gate electrode.

In the forming of the second conductive layer, the second conductive layer may be formed by using the third photoresist pattern.

According to one or more exemplary embodiments, a thin film transistor (TFT) substrate including: a first conductive layer on a non-pixel area of a substrate; a gate electrode on a pixel area of the substrate; a gate insulating layer covering the first conductive layer and the gate electrode and including a first contact hole exposing the first conductive layer; an oxide semiconductor pattern on the gate insulating layer of the pixel area, the oxide semiconductor pattern including a first region which is conductive, a second region which is conductive, and a third region disposed between the first region and the second region; a source electrode contacting the first region of the oxide semiconductor pattern and a drain electrode contacting the second region of the oxide semiconductor pattern; and a second conductive layer on the non-pixel area of the substrate and contacting the first conductive layer via the first contact hole. Each of the first region and the second region overlaps the gate electrode.

The third region may overlap the gate electrode, and each of an edge of the first region and an edge of the second region may overlap the gate electrode. The first and second regions may be adjacent to the third region.

Each of an edge of the source electrode adjacent to the gate electrode and an edge of the drain electrode adjacent to the gate electrode may not overlap the gate electrode.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
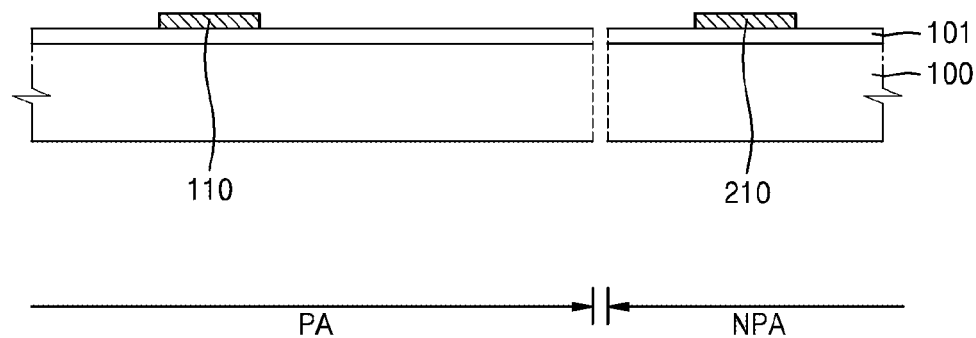
FIGS. 1, 2, 3, 4, 5, 6A, 6B, 7, 8, 9, 10, 11, 12, 13 and 14 illustrate a method of manufacturing a thin film transistor (TFT) array substrate, according to an exemplary embodiment.

As the inventive concept allows for various changes and numerous exemplary embodiments, particular exemplary embodiments will be illustrated in the drawings and described in detail in the written description. The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the exemplary embodiments set forth herein.

Hereinafter, the inventive concept will be described in detail by explaining exemplary embodiments of the inventive concept with reference to the attached drawings. Like reference numerals in the drawings denote like elements, and descriptions thereof will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "formed on" another layer, area, or component, it can be directly or indirectly formed on the other layer, area, or component. That is, for example, intervening layers, areas, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, area, or component is referred to as being "connected to" another layer, area, or component, it can be directly or indirectly connected to the other layer, area, or component. That is, for example, intervening layers, areas, or components may be present. For example, when a layer, area, or component is referred to as being "electrically connected to" another layer, area, or component, it can be directly or indirectly electrically connected to the other layer, area, or component, and intervening layers, areas, or components may be present for indirect electrical connection.

FIGS. 1 to 14 illustrate a method of manufacturing a thin film transistor (TFT) array substrate, according to an exemplary embodiment.

FIG. 1 illustrates a first mask process.

Referring to FIG. 1, a metal layer (not shown) is formed on a substrate 100 including a pixel area PA and a non-pixel area NPA, and patterned such that a gate electrode 110 and a first conductive layer 210 are formed. In the specification, the conductive layer indicates a layer having high electrical conductivity. That is, the conductive layer is an electrically conductive layer.

The pixel area PA is an area where pixels are formed and an image is provided, and the image may be provided via pixel areas PAs. The non-pixel area NPA is an area where an image is not displayed, and a driver circuit (an embedded circuit) for driving each pixel area PA or a fan-out wire may be formed in the non-pixel area NPA.

The substrate 100 may be formed of transparent materials such as glass or plastics which include polyethylene terephthalate (PET), polyethylene naphthalate (PEN), or polyimide. A buffer layer 101 may be formed on the substrate 100 in order to prevent impurities from the substrate 100 penetrating into active areas which will be formed thereon.

The gate electrode 110 and the first conductive layer 210 may be formed of a single metal, two or more metals, an alloy of the two or more metals, or the like. The gate electrode 110 and the first conductive layer 210 may be a single layer or layers.

FIGS. 2 to 7 illustrate a second mask process.

Figure 2:
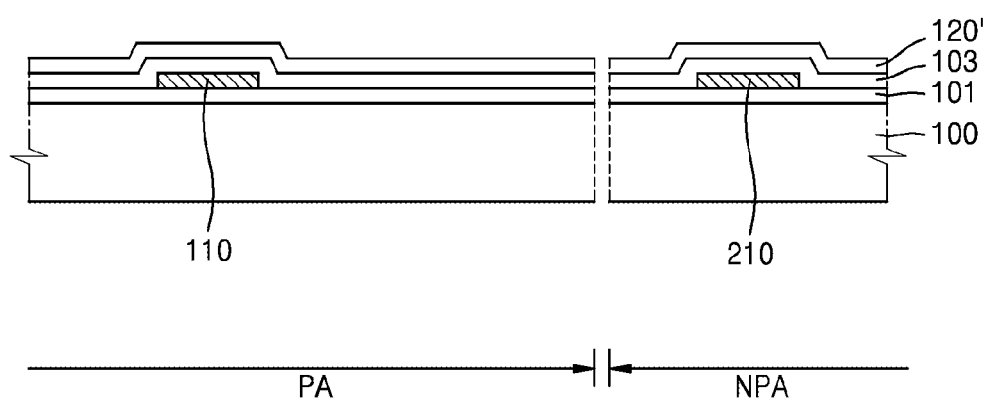

Referring to FIG. 2, a gate insulating layer 103 covering the gate electrode 110 and the first conductive layer 210 is formed on the substrate 100, and an oxide semiconductor layer 120' is formed on the gate insulating layer 103.

The gate insulating layer 103 may include an organic material or inorganic material that is electrically insulative. For example, the gate insulating layer 103 may include silicon oxide ($SiO_2$) or silicon nitride ($SiN_x$).

The oxide semiconductor layer 120' may be formed of an oxide including at least one selected from the group consisting of indium (In), gallium (Ga), zinc (Zn), and tin (Sn). For example, the oxide semiconductor layer 120' may include an oxide semiconductor such as zinc oxide ($ZnO_2$), tin oxide (SnO), indium oxide ($In_2O_3$), indium zinc oxide (IZO), indium tin oxide (ITO), In—Ga—Zn oxide, In—Zn—Sn oxide, or In—Ga—Zn—Sn oxide.

Figure 3:
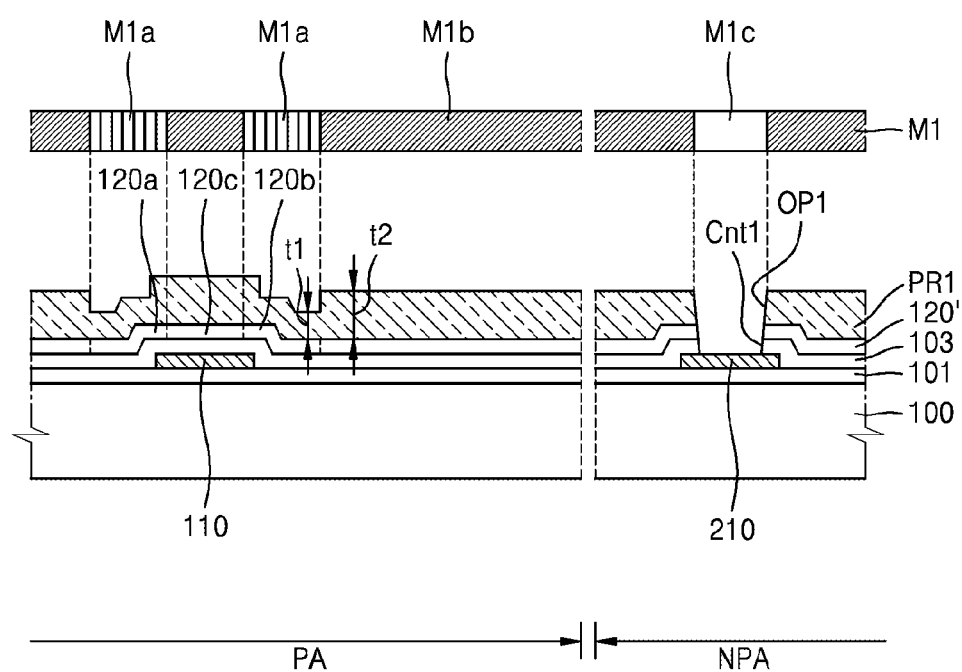

Referring to FIG. 3, a first photoresist pattern PR1 is formed on the oxide semiconductor layer 120' by using a halftone mask M1.

Portions of the first photoresist pattern PR1 corresponding to semi-transmissive portions M1a of the halftone mask M1 have a first thickness t1, a portion of the first photoresist pattern PR1 corresponding to a non-transmissive portion M1b of the halftone mask M1 has a second thickness t2. The second thickness t2 may be greater than the first thickness t1. The portions of the first photoresist pattern PR1 having the first thickness t1 correspond to a first region 120a and a second region 120b of the oxide semiconductor layer 120', and the portion of the first photoresist pattern PR1 having the second thickness t2 corresponds to a third region 120c of the oxide semiconductor layer 120'. A portion of the first photoresist pattern PR1 corresponding to a transmissive portion M1c may include a first opening OP1.

Layers exposed via the first opening OP1 of the first photoresist pattern PR1 are removed by etching, etc. A first contact hole Cnt1 penetrating the gate insulating layer 103 is formed by etching and a portion of the first conductive layer 210 may be exposed via the first contact hole Cnt1.

As a non-restrictive exemplary embodiment, in FIG. 3, when the oxide semiconductor layer 120' is formed on the entire substrate 100, a portion of the gate insulating layer 103 and a portion of the oxide semiconductor layer 120' may be removed via the first contact hole Cnt1. As another exemplary embodiment, when the oxide semiconductor layer 120' is formed or patterned only on the pixel area PA, the gate insulating layer 103 may be removed via the first opening OP1.

In the present exemplary embodiment, a case where the first photoresist pattern PR1 is formed by forming the halftone mask M1 is described, but the inventive concept is not limited thereto. As another exemplary embodiment, a diffraction mask (slit mask) may be used instead of the halftone mask M1.

In the present exemplary embodiment, the first photoresist pattern PR1 is of a positive type, the first opening OP1 is formed in the portion of the first photoresist pattern PR1 corresponding to the transmissive portion M1c, and the portion of the first photoresist pattern PR1 corresponding to the non-transmissive portion M1b has the second thickness t2. However, the inventive concept is not limited thereto. As another exemplary embodiment, if locations of the transmissive portion M1c and the non-transmissive portion M1b of FIG. 3 may be exchanged, the first photoresist pattern PR1 may be of a negative type.

Figure 4:
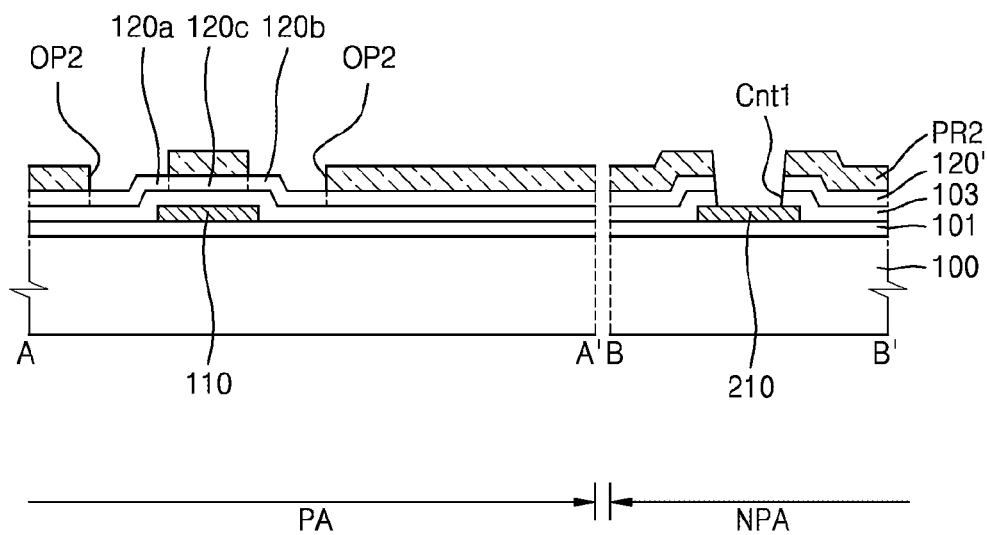

Referring to FIG. 4, a second photoresist pattern PR2 having second openings OP2 is formed by ashing. The second openings OP2 is formed by removing the portions of the first photoresist pattern PR1 corresponding to the semi-transmissive portions M1a. The portion of the first photoresist pattern PR1 corresponding to the non-transmissive portion M1b and having the second thickness t2 is reduced in thickness by ashing and remains in the second photoresist pattern PR2.

Figure 5:
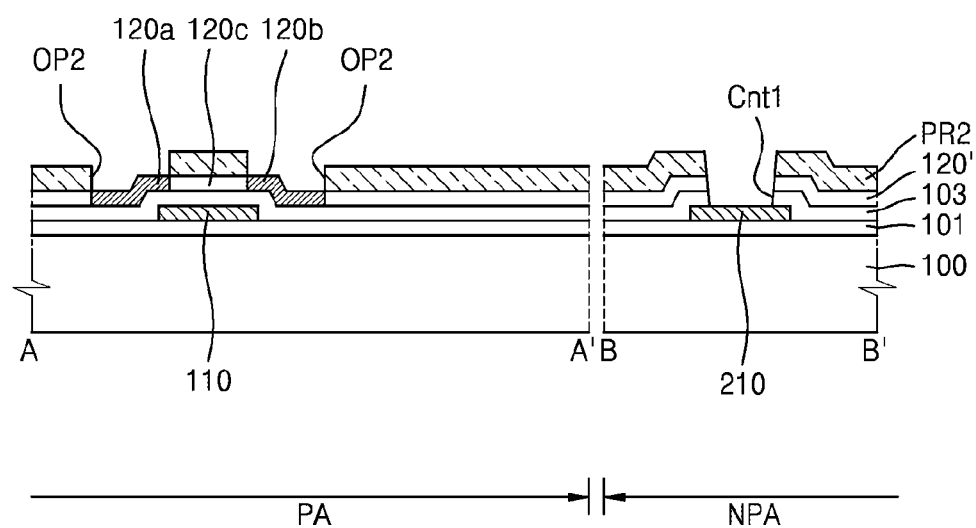

Referring to FIG. 5, the first region 120a and the second region 120b exposed via the second opening OP2 of the second photoresist pattern PR2 are processed to be conductive. The third region 120c between the first region 120a and the second region 120b is covered by the second photoresist pattern PR2 and thus may not be processed.

Figure 6A:
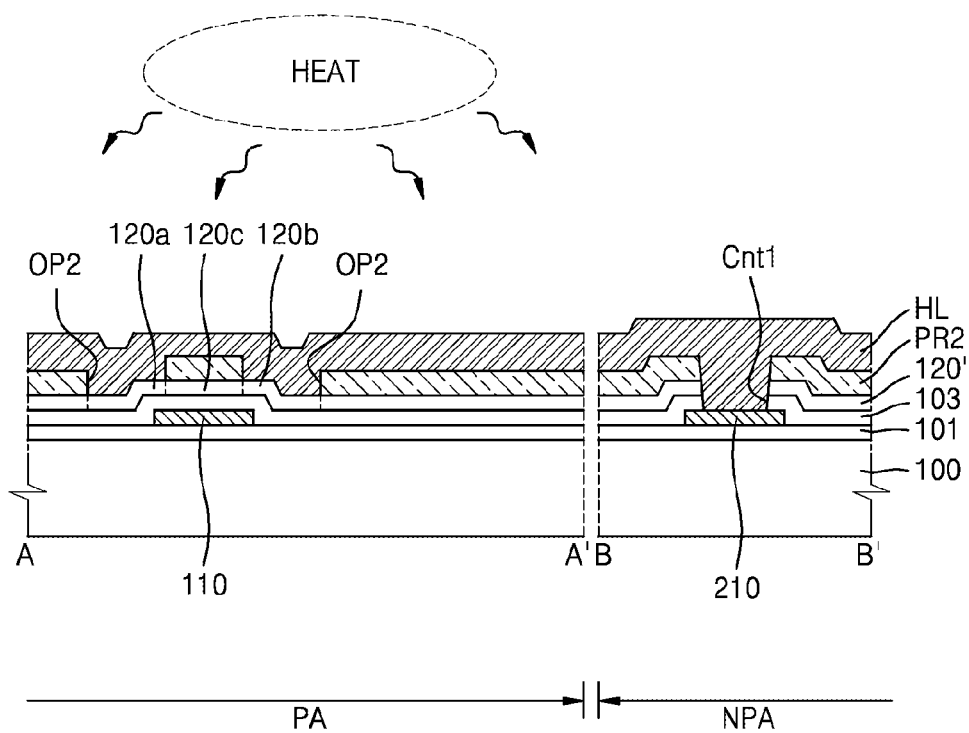
Figure 6B:
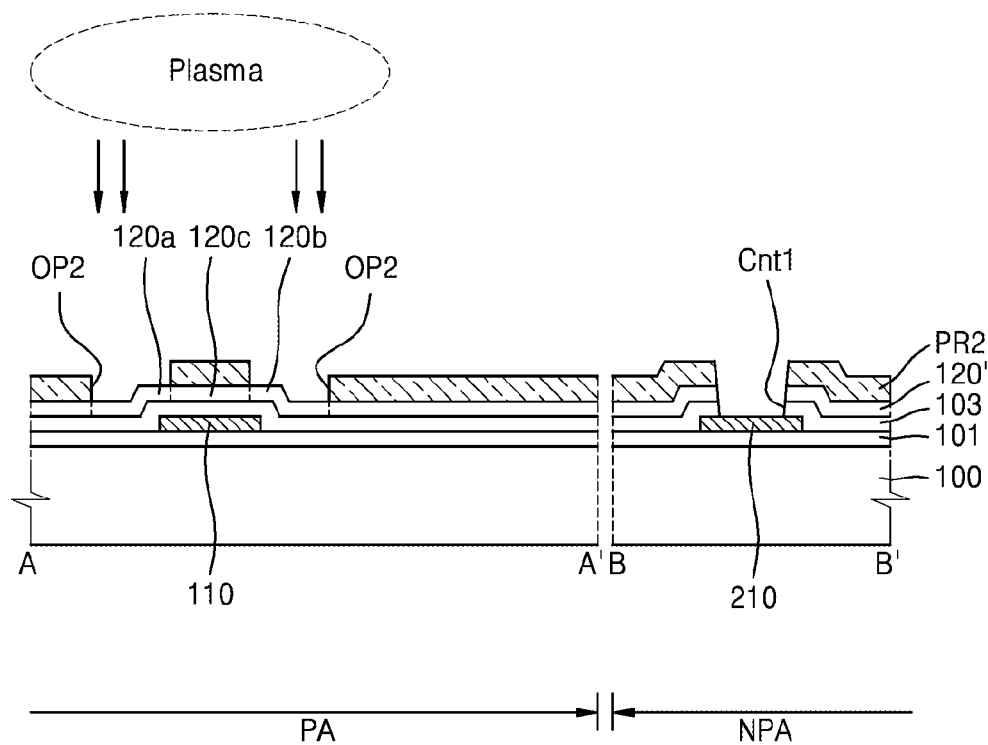

A method for enhancing the conductivity of the first region 120a and the second region 120b may include a method of forming a layer including hydrogen (H) and performing a heat treatment therefor or a plasma treatment method, and descriptions of each method are provided with reference to FIGS. 6A and 6B.

Referring to FIG. 6A as an exemplary embodiment, after forming a layer including hydrogen on the first region 120a and the second region 120b, which are exposed through the second opening OP2 of the second photoresist pattern PR2, a heat treatment is performed.

The layer HL including hydrogen is formed on the second photoresist pattern PR2. The layer HL may be formed of $SiN_x$. Hydrogen generated during a process of depositing the layer HL, which uses silane ($SiH_4$) or ammonia ($NH_3$) as reaction gases, is combined with oxygen ($O_2$) in an oxide semiconductor included in the first region 120a and the second region 120b exposed via the second opening OP2. Oxygen vacancies formed in the oxide semiconductor during the formation of the $SiN_x$ may generate holes which increase conductivity of the first region 120a and the second region 120b. Also, the number of holes in the first region 120a and the second region 120b is increasing because hydrogen included in the layer HL is diffused into the first region 120a and the second region 120b during the heat treatment. Thus, the first region 120a and the second region 120b become conductive.

Referring to FIG. 6B as another exemplary embodiment, a plasma treatment may be directly performed on the first region 120a and the second region 120b exposed via the second opening OP2 of the second photoresist pattern PR2, and thus, the first region 120a and the second region 120b may become conductive.

During the plasma treatment, as particles having high energy in a plasma state impact a surface of a material, the surface of the material is chemically or physically modified. According to an exemplary embodiment, in the plasma treatment, at least one gas selected from the group consisting of hydrogen (H) gas, argon (Ar) gas, helium (He) gas, xenon (Xe) gas, nitrogen (N) gas, nitrogen oxide gas, oxygen gas, and a combination thereof may be used.

Since the oxide semiconductor is reduced (deoxidized) through the plasma treatment, an oxygen defect included in the oxide semiconductor is induced, and thus, oxygen vacancies in the oxide semiconductor may be increased. The oxide semiconductor having the increased oxygen vacancy may shift a threshold voltage, which is a critical voltage to flow charges in the oxide semiconductor, in a negative direction. The negative shift of the threshold voltage means the oxide semiconductor becomes conductive.

Figure 7:
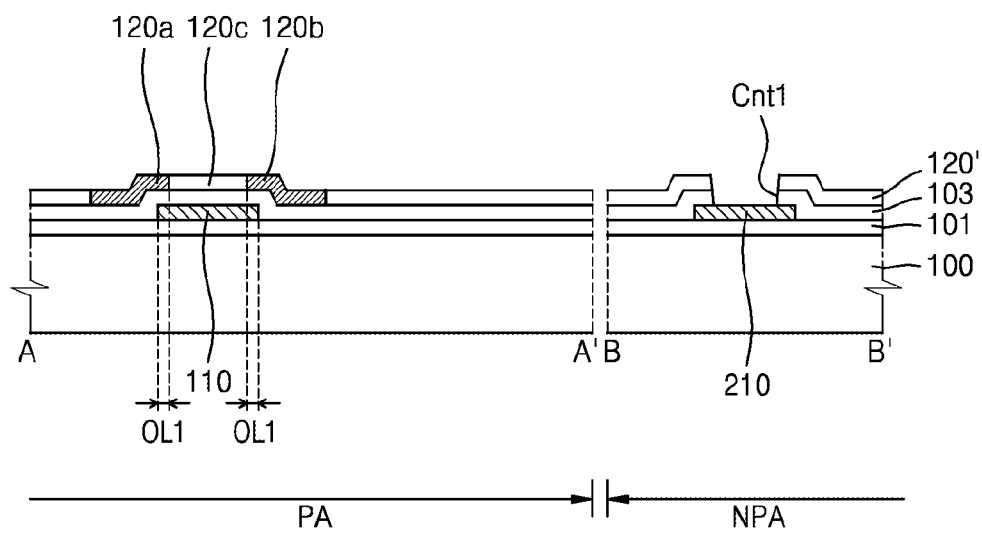

Referring to FIG. 7, as illustrated in FIG. 5, after the first region 120*a* and the second region 120*b* are processed to be conductive, the second photoresist pattern PR2 is removed.

The first region 120*a* and the second region 120*b* overlap the gate electrode 110. For example, the gate electrode 110 and edges of the first region 120*a* and the second region 120*b* that are adjacent to the third region 120*c* may form an overlapping region OL1. The overlapping region OL1 may be from about 0.01 μm to about 1 μm, but the inventive concept is not limited thereto.

FIGS. 8 to 11 illustrate a third mask process.

Figure 8:
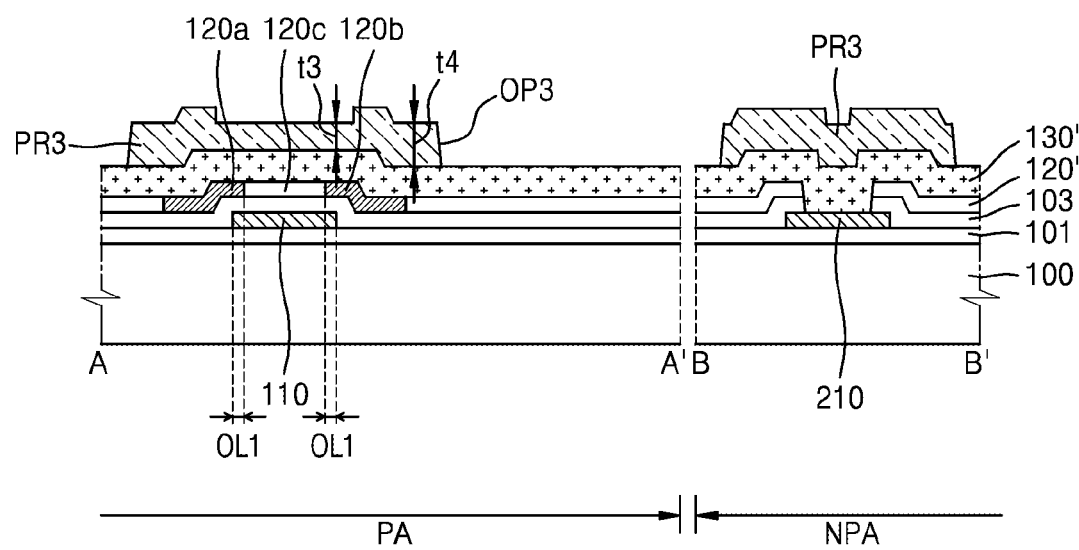

Referring to FIG. 8, after a metal layer 130' is formed, a third photoresist pattern PR3 is formed on the metal layer 130' by using a halftone mask (not shown).

The metal layer 130' may be formed of a single metal, two or more metals, an alloy of the two or more metals, etc. The gate electrode 110 and the first conductive layer 210 may be a single layer or multi-layers.

Portions of the third photoresist pattern PR3, which overlap the third region 120*c* and portions of the first region 120*a* and the second region 120*b*, have a third thickness t3, and portions of the third photoresist pattern PR3, which cover the first conductive layer 210, and portions of the third photoresist pattern PR3, which cover other portions of the first region 120*a* and the second region 120*b*, have a fourth thickness t4. The fourth thickness t4 is greater than the third thickness t3. A width of the portions of the third photoresist pattern PR3 having the third thickness t3 may be greater than a width of the gate electrode 110.

Figure 9:
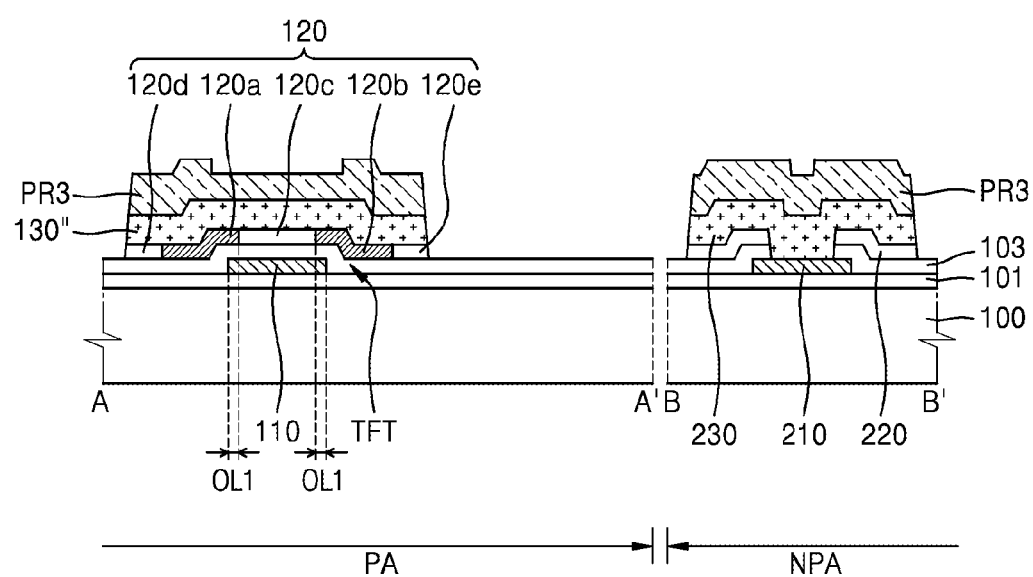

Referring to FIG. 9, the oxide semiconductor layer 120' is patterned by using the third photoresist pattern PR3 having a third opening OP3 as a mask. As a result of patterning the oxide semiconductor layer 120', an oxide semiconductor pattern 120 including the first region 120*a* and the second region 120*b*, and the third region 120*c* disposed therebetween is formed on the pixel area PA, and a second conductive layer 230 connected to the first conductive layer 210 is formed on the non-pixel area NPA.

According to a size of the third photoresist pattern PR3, the oxide semiconductor pattern 120 may further include a fourth region 120*d* and a fifth region 120*e* which are not processed to be conductive and are formed on edges of the first to third regions 120*a* to 120*c*. While the oxide semiconductor layer 120' is patterned, the metal layer 130' formed on the oxide semiconductor layer 120' is also patterned into a metal layer 130" having the same pattern as the oxide semiconductor pattern 120.

Figure 10:
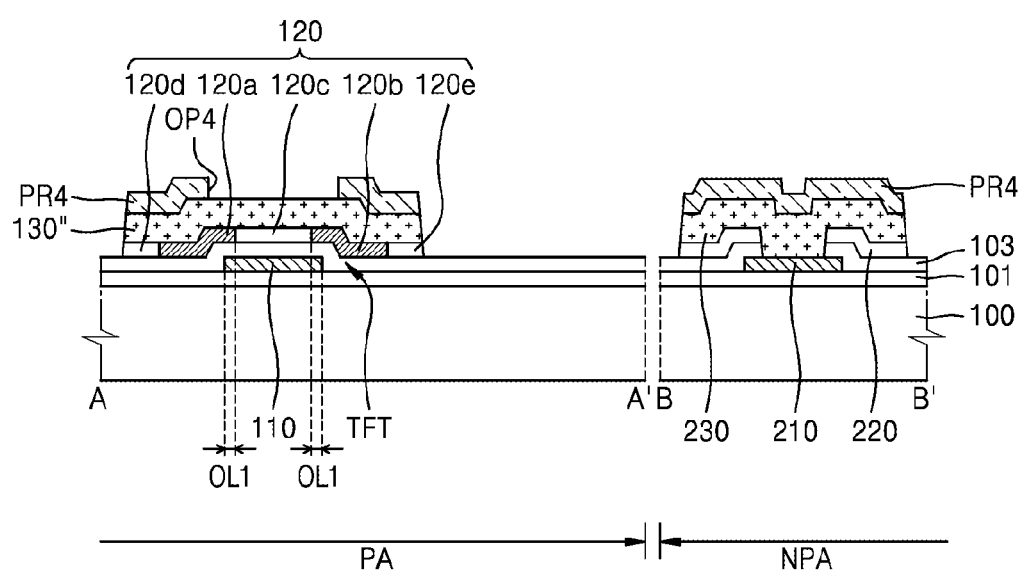

Referring to FIG. 10, a fourth photoresist pattern PR4 having a fourth opening OP4 is formed by an ashing process. The fourth opening OP4 is formed by removing the portion of the third photoresist pattern PR3 having the third thickness t3. Since the portion of the third photoresist pattern PR3 having the third thickness t3 has a greater width than the gate electrode 110, a width of the fourth opening OP4 of the fourth photoresist pattern PR4 may be greater than the width of the gate electrode 110. On the other hand, even if the portion of the third photoresist pattern PR3 having the third thickness t3 does not have a greater width than the gate electrode 110, a width of the fourth opening OP4 of the fourth photoresist pattern PR4 may be greater than the width of the gate electrode 110 during the ashing process because side portions of the third photoresist pattern PR3 may also be removed during the ashing process.

Figure 11:
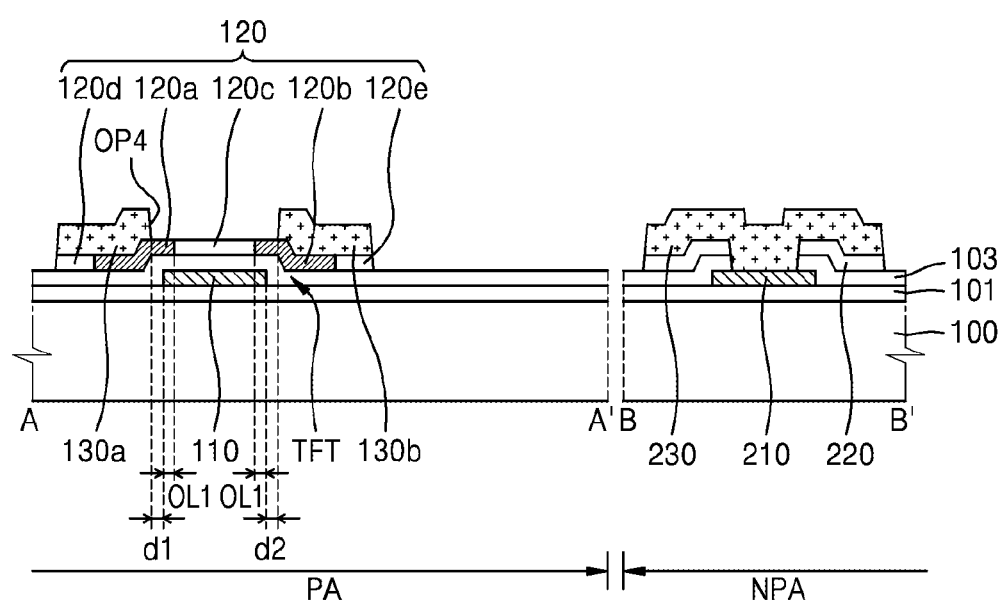

Referring to FIG. 11, a drain electrode 130*a* contacting the first region 120*a*, a source electrode 130*b* contacting the second region 120*b* are respectively formed by removing the metal layer 130" exposed via the fourth opening OP4. The fourth photoresist pattern PR4 is removed after forming the drain electrode 130*a* and the source electrode 130*b*.

An edge of the drain electrode 130*a*, for example, an edge of the drain electrode 130*a* that is adjacent to one edge of the gate electrode 110 and/or the third region 120*c*, is spaced apart from the gate electrode 110 by a first distance d1 and thus does not overlap the gate electrode 110. An edge of the source electrode 130*b*, for example, an edge of the source electrode 130*b* adjacent to an opposite edge of the gate electrode 110 and/or the third region 120*c*, is spaced apart from the gate electrode 110 by a second distance d2 and thus does not overlap the gate electrode 110. The first distance d1 and the second distance d2 may be same. The first distance d1 and the second distance d2 may be from about 0 μm to about 2 μm, but the inventive concept is not limited thereto.

In the present exemplary embodiment, referring to FIGS. 8 to 11, it has been described that a process of forming the source electrode 130*b*, the drain electrode 130*a*, and the second conductive layer 230, and a process of forming the oxide semiconductor pattern 120 by patterning the oxide semiconductor layer 120' are performed in the same mask process. However, the inventive concept is not limited thereto.

As another exemplary embodiment, a mask used when the oxide semiconductor layer 120' is patterned may be different from a mask used when the source electrode 130*b*, the drain electrode 130*a*, and the second conductive layer 230 are formed. As illustrated in FIG. 7, the oxide semiconductor layer 120' is patterned after the first region 120*a* and the second region 120*b* are processed to be conductive, or as illustrated in FIG. 2, oxide semiconductor layer 120' is patterned before the first region 120*a* and the second region 120*b* are processed to be conductive. In this case, since two masks are used, the number of masks is greater than in the processes described with reference to FIGS. 8 to 11.

Figure 12:
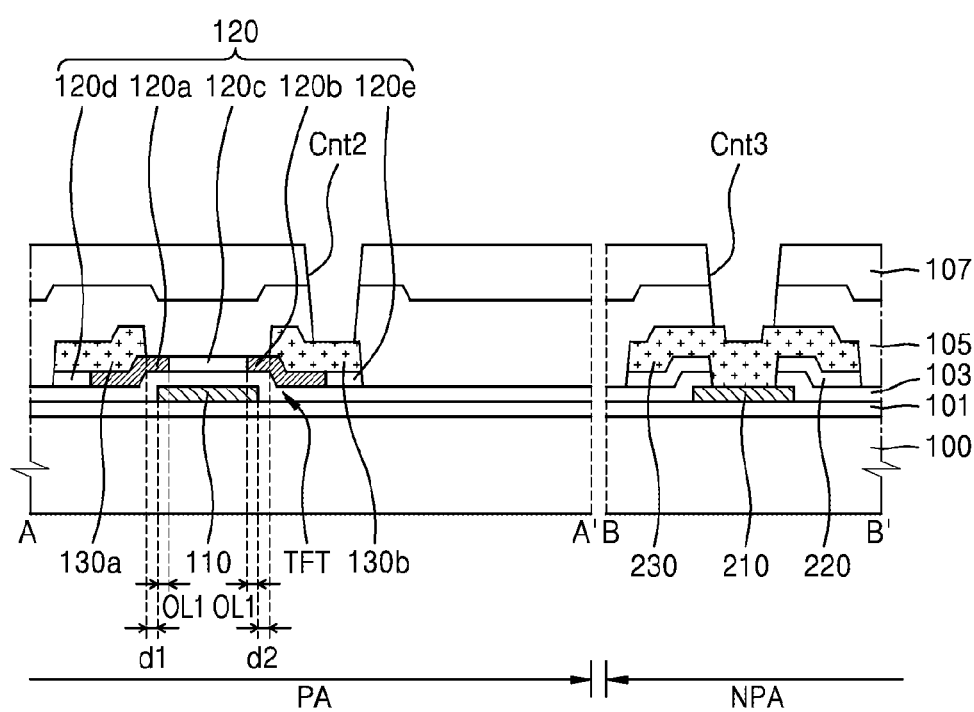

FIG. 12 illustrates a fourth mask process.

Referring to FIG. 12, a first insulating layer 105 is formed as a passivation layer, and a second insulating layer 107 is formed as a planarization layer. Then, a second contact hole Cnt2 is formed in the second insulating layer 107 and the first insulating layer 105 until any one of the drain electrode 130*a* and the source electrode 130*b* is exposed. As a non-restrictive exemplary embodiment of the inventive concept, a third contact hole Cnt3 may be formed in the non-pixel area NPA until the second conductive layer 230 is exposed.

The first insulating layer 105 may be formed of an inorganic material such as $SiO_2$ and/or SiNx, and the second insulating layer 107 may be formed of an organic material.

Figure 13:
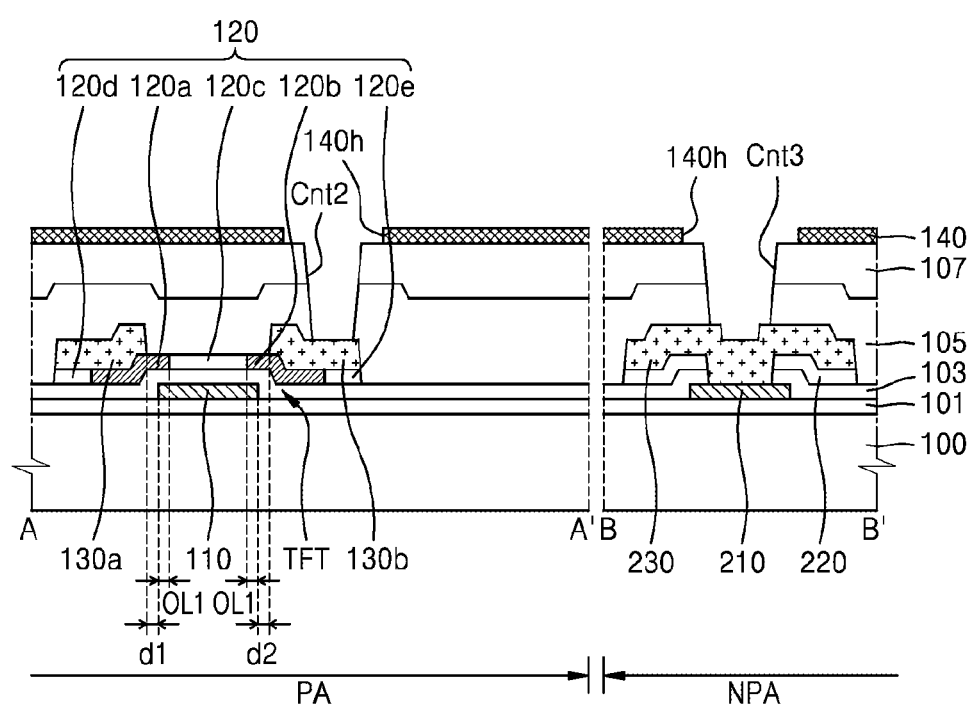

FIG. 13 illustrates a fifth mask process.

Referring to FIG. 13, a conductive layer (not shown) is formed on the second insulating layer 107, and is patterned such that an opposite electrode 140 is formed. The opposite electrode 140 may be integrally formed on an entire surface of the substrate 100. The opposite electrode 140 includes a hole 140*h* formed on a location corresponding to the second and third contact holes Cnt2 and Cnt3 and may be formed of a transparent conductive material. For example, the opposite electrode 140 may be formed of a transparent conductive oxide such as ITO, IZO, and ITZO.

The fourth mask process and the fifth mask process may be performed using the same mask. For example, after sequentially forming the first insulating layer 105, the second insulating layer 107 and the conductive layer (not shown), a mask exposing the second contact hole Cnt2 and the third contact hole Cnt3 is formed of the conductive layer (not shown). The conductive layer (not shown), the second insulating layer 107 and the first conductive layer 105 may be sequentially removed using the same mask as an etching mask. After removing the conductive layer (not shown), the second insulating layer 107 and the first conductive layer 105, the conductive layer (not shown) may be removed to form a recess portion recessed from an edge of the second contact hole Cnt2 and the third contact hole Cnt3 to prevent short circuit between the opposite electrode 140 and a pixel electrode 150 and a third electrode 250 to be formed.

Figure 14:
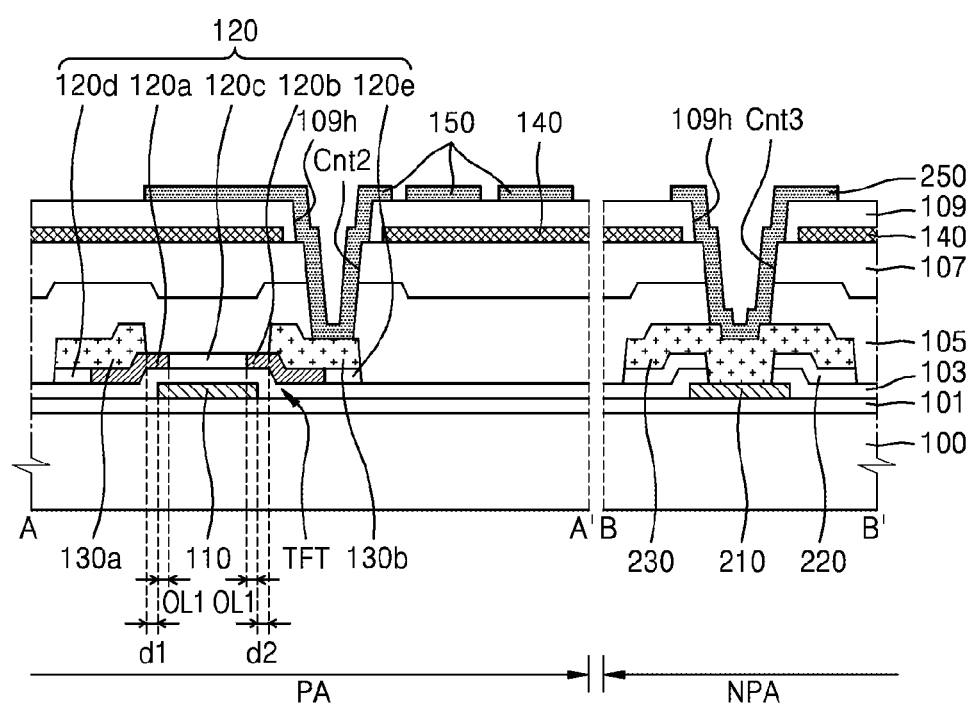

FIG. 14 illustrates a sixth and seventh mask processes.

Referring to FIG. 14, a third insulating layer 109 is formed on the opposite electrode 140 as a passivation layer, and a hole 109h is formed at a location corresponding to the second and third contact holes Cnt2 and Cnt3 (the sixth mask process). The third insulating layer 109 may be formed of an inorganic material such as $SiO_2$ and/or SiNx.

Then, a conductive layer (not shown) is formed on the substrate 100, and is patterned such that pixel electrodes 150 are formed (the seventh mask process). The pixel electrodes 150 are electrically connected to the source electrode 130b via the second contact hole Cnt2 and the hole 109h. The pixel electrodes 150 may be formed of a transparent conductive material. For example, the pixel electrodes 150 may be formed of a transparent conductive oxide such as ITO, IZO, and ITZO.

As a non-restrictive exemplary embodiment, when the pixel electrodes 150 are patterned, a third conductive layer 250 may be formed on the non-pixel area NPA and be electrically connected to the second conductive layer 230 via the third contact hole Cnt3 and the hole 109h.

In a TFT array substrate manufactured by the method described above, the first region 120a and the second region 120b overlap the gate electrode 110, and the drain electrode 130a and the source electrode 130b that respectively contact the first region 120a and the second region 120b may not overlap the gate electrode 110. As the source electrode 130b does not overlap the gate electrode 110, a kickback voltage may decrease, and as the first region 120a and the second region 120b, which are processed to be conductive, overlap the gate electrode 110, a decrease of an absolute value of a current flowing in the TFT of the pixel area PA may be prevented. Therefore, a decrease in a pixel charging rate may be prevented.

Figure 15:
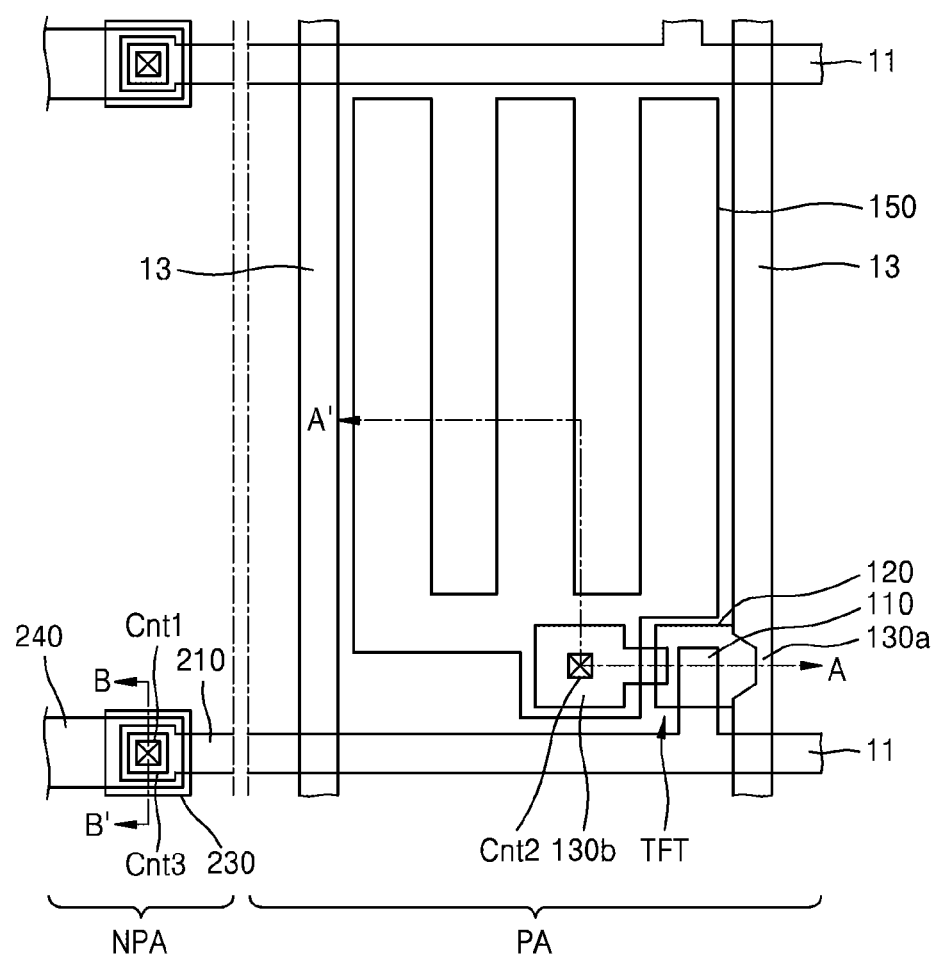
FIG. 15 illustrates a plan view of a liquid crystal display (LCD) apparatus as a display apparatus including a TFT array substrate, according to an exemplary embodiment.
Figure 16:
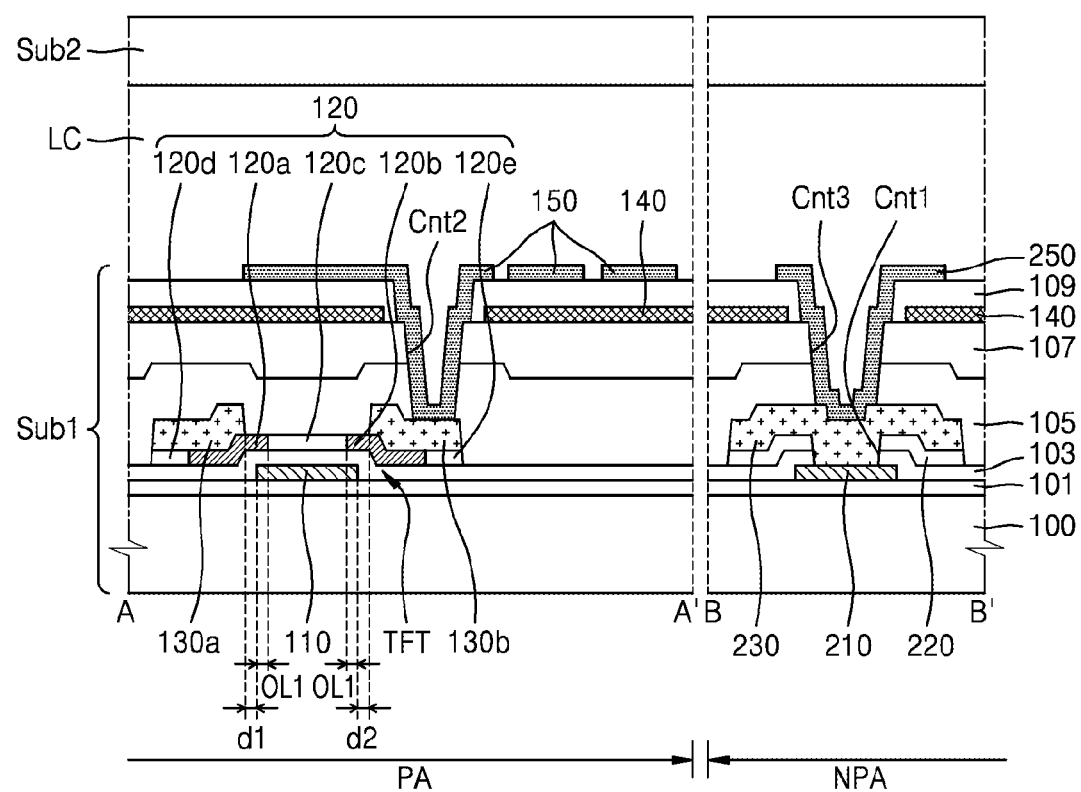
FIG. 16 illustrates a cross-sectional view taken along a line A-A' and a line B-B' of FIG. 15.

FIG. 15 illustrates a plan view of a liquid crystal display (LCD) apparatus as a display apparatus including a TFT array substrate, according to an exemplary embodiment, and FIG. 16 illustrates a cross-sectional view taken along a line A-A' and a line B-B' of FIG. 15.

Referring to FIGS. 15 and 16, the LCD apparatus includes a TFT array substrate (hereinafter, referred to as an array substrate Sub1), a counter substrate Sub2, and a liquid crystal layer LC therebetween.

Gate lines 11 extending in a first direction and data lines 13 extending in a second direction are formed on the array substrate Sub1, and the pixel area PA is formed on a location where the gate lines 11 and the data lines 13 cross each other.

A TFT is formed on the pixel area PA, and the gate electrode 110 of the TFT may be an area protruding from the gate lines 11 or a portion of the gate lines 11. The drain electrode 130a of the TFT may be a portion of the data lines 13, and the source electrode 130b contacts the pixel electrodes 150 via the second contact hole Cnt2. The oxide semiconductor pattern 120 including the first region 120a and the second region 120b which are conductive is disposed between the gate electrode 110 and the drain electrode 130a and the source electrode 130b.

Since the drain electrode 130a and the source electrode 130b are respectively spaced part from the edges of the gate electrode 110 by the first distance d1 and the second distance d2, a kickback voltage generated by the parasitic capacitance between the gate electrode 110 and the source electrode 130b may be minimized. Since the first region 120a and the second region 120b which are conductive overlap the gate electrode 110, a decrease of an absolute value of a current flowing to the third region 120c that is a channel area may be prevented.

The first to third conductive layers 210, 230, and 250 contacting each other via the first and third contact holes Cnt1 and Cnt3 may be formed together on the non-pixel area NPA during a process of forming the TFT and the pixel electrodes 150 on the pixel area PA. The first to third conductive layers 210, 230, and 250 may form a portion of a driver circuit (an embedded circuit) or a fan-out wire.

In the present exemplary embodiment, the first to third conductive layers 210, 230, and 250 are formed on the non-pixel area NPA, but according to another exemplary embodiment, two of the first to third conductive layers 210, 230, and 250 may be formed. Detailed descriptions of the array substrate Sub1 are the same as those described with reference to FIGS. 1 to 14 and thus are omitted.

According to the method of manufacturing the TFT array substrate and the TFT array substrate manufactured by the method according to the one or more exemplary embodiments of the inventive concept, a decrease of an absolute value of a current flowing to a TFT may be prevented, and a kickback voltage may be minimized.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A thin film transistor (TFT) substrate comprising:
a first conductive layer on a non-pixel area of a substrate;
a gate electrode on a pixel area of the substrate;
an insulating layer covering the first conductive layer and the gate electrode and comprising a first contact hole exposing the first conductive layer;
an oxide semiconductor pattern on the insulating layer of the pixel area, the oxide semiconductor pattern comprising a first region which is conductive, a second region which is conductive, a third region disposed between the first region and the second region;
a source electrode contacting the first region of the oxide semiconductor pattern and a drain electrode contacting the second region of the oxide semiconductor pattern; and
a second conductive layer on the non-pixel area of the substrate and contacting the first conductive layer via the first contact hole, wherein each of the first region and the second region overlaps the gate electrode, wherein each of the source electrode and the drain electrode includes an inner sidewall adjacent to the third region and an outer sidewall far away from the third region, wherein an outer sidewall of the source electrode and a first sidewall of the oxide semiconductor pattern are disposed along substantially a same line, and an outer sidewall of the drain electrode and a second sidewall of the oxide semiconductor pattern are disposed along substantially a same line, and wherein a distance between the inner sidewall of the source electrode and the inner sidewall of the drain electrode is greater than a width of the gate electrode.

2. The TFT substrate of claim 1, wherein the third region overlaps the gate electrode, and each of an edge of the first region and an edge of the second region overlaps the gate electrode, wherein the first and second regions are adjacent to the third region.

3. The TFT substrate of claim 1, wherein each of an edge of the source electrode adjacent to the gate electrode and an edge of the drain electrode adjacent to the gate electrode does not overlap the gate electrode.

4. The TFT substrate of claim 3, wherein a distance between the edge of the source electrode and the gate electrode is from 0 μm to 2 μm.

5. The TFT substrate of claim 4, wherein a distance between the edge of the drain electrode and the gate electrode is from 0 μm to 2 μm.

6. A thin film transistor (TFT) substrate comprising:
a first conductive layer on a non-pixel area of a substrate;
a gate electrode on a pixel area of the substrate;
an insulating layer covering the first conductive layer and the gate electrode and comprising a first contact hole exposing the first conductive layer;
an oxide semiconductor pattern on the insulating layer of the pixel area, the oxide semiconductor pattern comprising a first region which is conductive, a second region which is conductive, a third region disposed between the first region and the second region;
a source electrode contacting the first region of the oxide semiconductor pattern and a drain electrode contacting the second region of the oxide semiconductor pattern; and
a second conductive layer on the non-pixel area of the substrate and contacting the first conductive layer via the first contact hole, wherein each of the first region and the second region overlaps the gate electrode, wherein a sidewall of the source electrode is vertically aligned to a first sidewall of the oxide semiconductor pattern, and a sidewall of the drain electrode is vertically aligned to a second sidewall of the oxide semiconductor pattern, and wherein the oxide semiconductor pattern further comprises a fourth region which is not processed to be conductive and disposed on a region opposite to the third region with respect to the first region, and a fifth region which is not processed to be conductive and disposed on a region opposite to the third region with respect to the second region.

7. The TFT substrate of claim 6, wherein the fourth region and the fifth region are disposed to overlap the source electrode and the drain electrode in a plan view, respectively.

8. The TFT substrate of claim 7, wherein an edge of the fourth region and an edge of the fifth region are aligned with an edge of the source electrode and an edge of the drain electrode, respectively.

* * * * *